(12) United States Patent
Eidelman et al.

(10) Patent No.: US 8,652,257 B2
(45) Date of Patent: Feb. 18, 2014

(54) CONTROLLED GRAVITY FEEDING CZOCHRALSKI APPARATUS WITH ON THE WAY MELTING RAW MATERIAL

(76) Inventors: Lev George Eidelman, Las Vegas, NV (US); Vladimir Ilya Zheleznyak, Las Vegas, NV (US)

( * ) Notice: Subject to any disclaimer, the term of this patent is extended or adjusted under 35 U.S.C. 154(b) by 1033 days.

(21) Appl. No.: 13/385,609

(22) Filed: Feb. 22, 2010

(65) Prior Publication Data

US 2013/0220215 A1 Aug. 29, 2013

(51) Int. Cl.
*C30B 15/02* (2006.01)

(52) U.S. Cl.
USPC ............. 117/214; 117/11; 117/13; 117/14; 117/15; 117/16; 117/30; 117/31; 117/33; 117/200; 117/201; 117/202; 117/206; 117/208; 117/213; 117/217; 422/253

(58) Field of Classification Search
USPC ............... 117/11, 13–15, 18, 30–31, 33, 117/200–202, 206, 208, 213–214, 217, 912, 117/928, 931–932; 422/253
See application file for complete search history.

(56) References Cited

U.S. PATENT DOCUMENTS

| | | | |
|---|---|---|---|
| 2,892,739 A | 6/1959 | Rusler | |
| 3,507,625 A | 4/1970 | Deyris | |
| 3,998,686 A * | 12/1976 | Meiling et al. | 117/33 |
| 4,036,595 A * | 7/1977 | Lorenzini et al. | 117/202 |
| 4,203,951 A * | 5/1980 | Goriletsky et al. | 117/213 |
| 4,282,184 A | 8/1981 | Fiegl et al. | |
| 4,547,258 A | 10/1985 | Witter et al. | |
| 4,659,421 A | 4/1987 | Jewett | |
| 5,087,321 A | 2/1992 | Kamio et al. | |
| 5,087,429 A | 2/1992 | Kamio et al. | |
| 5,126,114 A | 6/1992 | Kamio et al. | |
| 5,139,750 A | 8/1992 | Shima et al. | |
| 5,143,704 A | 9/1992 | Nakahama et al. | |
| 5,242,531 A | 9/1993 | Klingshim et al. | |
| 5,242,667 A * | 9/1993 | Koziol et al. | 117/214 |
| 5,270,020 A | 12/1993 | Suzuki et al. | |
| 5,290,395 A * | 3/1994 | Matsumoto et al. | 117/18 |
| 5,314,667 A | 5/1994 | Lim et al. | |
| 5,324,488 A * | 6/1994 | Klingshirn et al. | 117/213 |
| 5,360,480 A * | 11/1994 | Altekruger | 117/214 |

(Continued)

OTHER PUBLICATIONS

V.I. Goriletsky et al., "Automated pulling of alkali halide single crystals", Journal of Crystal Growth 52 (1981) 509-513.

(Continued)

*Primary Examiner* — Michael Kornakov
*Assistant Examiner* — Kenneth A Bratland, Jr.

(57) ABSTRACT

A melting furnace, mounted adjacent a growth furnace, comprises a receiving container for melting therein raw material in a particle or powder form falling in it from a feeder. The receiving container accommodates a set of slope-wise plates providing a distributed sliding of partially melted raw material particles over the surface of these plates and their complete melting while moving downward; eventually the melted raw material flows into the crucible of the growth furnace through a conveying tube extending slantingly from the bottom of the receiving container to the crucible through coaxial openings in housings of both furnaces. The rate of feeding is given solely by the feeder, and at continuous feeding the raw material flows continuously by gravity from the feeder to the crucible of the growth furnace, first in a solid state (powder, granules, pellets, etc.) and then in a liquid state.

5 Claims, 4 Drawing Sheets

(56) References Cited

U.S. PATENT DOCUMENTS

| | | | |
|---|---|---|---|
| 5,462,011 A | 10/1995 | Tomzig et al. | |
| 5,580,171 A | * 12/1996 | Lim et al. | 366/336 |
| 5,820,649 A | 10/1998 | Ogure et al. | |
| 6,231,669 B1 | 5/2001 | Altekruger et al. | |

OTHER PUBLICATIONS

L.G. Eidelman et al., "Automated pulling from the melt—an effective method for growing large alkali halide single crystals", Journal of Crystal Growth 128 (1993) 1059-1061.

* cited by examiner

PRIOR ART

CONTROLLED GRAVITY FEEDING CZOCHRALSKI APPARATUS WITH ON THE WAY MELTING RAW MATERIAL

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not Applicable

STATEMENT REGARDING PRIOR DISCLOSURES BY THE INVENTOR OR A JOINT INVENTOR

Not Applicable

BACKGROUND OF THE INVENTION

The invention relates to the technique and apparatus for pulling single crystals from the melt on the seed by the Czochralski method (hereafter called CZ method), and more particularly relates to the pulling process in which the crucible of the growth furnace is continuously replenished with raw material in order to pull a longer single crystal through a single run of the growth furnace.

The invention may be efficiently used in growing oriented large-sized single crystals of various substances, such as scintillation alkali halide single crystals (e.g. NaI(Tl), CsI(Tl), CsI(Na)) and semiconductor single crystals (e.g. Si, Ge).

According to CZ method a single crystal is grown in the following manner. Starting material is melted in the crucible, and a rotating vertical rod carrying a seed crystal is lowered until the seed comes in contact with the melt. After the lower end of seed crystal is partially melted, the melt temperature is reduced to stop further melting. Then the rod carrying seed crystal is slowly moved up, and the single crystal grows on seed crystal. This method is carried out in a non-continuous manner: that is, the entire amount of raw material required for getting single crystal of particular dimensions is loaded into the crucible at the beginning, and the pulling process is terminated after most of this material has been consumed. The demand for crystals of greater length and greater diameter resulted in a trend toward the use of continuous pulling method (hereafter called CCZ=continuous Czochralski method), in which the crucible is additionally fed with raw material during the growth process.

Together with greater dimensions of the grown crystal, the CCZ method provides a way to get homogeneous distribution of doping impurities along the crystal length, which cannot be achieved by CZ method. The solubility of impurities in the solid material of the growing crystal is significantly less than that in the melt; that is why in the CZ process, where amount of melt in the crucible decreases over time, the concentration of the additive in melt simultaneously increases, so that its concentration in the most recently pulled part of crystal is much higher than that in the part of the crystal pulled first. In continuous CCZ process the amount of the melt in the crucible may be kept constant and the decrease of the concentration of the additive in the melt due to its entering into growing crystal may be compensated by adjusting the concentration of the additive in the material being used to replenish the melt. In this case the constant concentration of the doping impurity in the melt will provide its homogeneous distribution in the whole volume of the grown crystal.

While the CZ and CCZ methods enable the production of single crystals of higher quality compared with those obtained by other known methods of growing crystals, pulling single crystals with preset properties and perfect crystalline structure requires compliance with a number of rigorous conditions such as provision of stability and axial symmetry of the thermal fields in the melt and in the growing crystal, maintenance of preset growth rate and preselected shape of the solid-liquid interface, and assurance of stability of the growing crystal diameter; thus known in the art apparatus are considered below taking into account these requirements.

Known in the art are apparatus comprising a stationary crucible consisting of two communicated containers having a common heater or individual heaters (U.S. Pat. Nos. 3,507,625, 4,547,258 and 5,290,395, for example). Raw material in a particle or powder form is fed to one container, where it is melted, and a rotating single crystal is pulled from the other container. Molten raw material flows through connecting part of the crucible keeping the same melt level in both containers. The disadvantage of these apparatus consist in that an axially symmetric thermal fields in the melt and in the growing crystal cannot be obtained because of lack of axial symmetry of the crucible and impossibility of crucible rotation.

In an apparatus disclosed in U.S. Pat. No. 2,892,739 a crucible consist of two cylindrical containers arranged coaxially with respect to each other with a vertical space between them equal to the difference in their heights and a radial space between them equal to the difference in their radii so that an annular space is defined between two containers to which parades of raw material are fed. The inner container has a hole in its bottom which provides communication between its inner space and the outer annular space. The crucible is mounted on a plate resting on a rotary rod and is surrounded by a cylindrical heater. The crystal pulling mechanism includes a vertical rotary rod with a seed crystal holder on its lower end. A vertical-tube is located over the annular space for feeding with raw material in a particle or powder form. After raw material is melted in the crucible, the growing-process begins in the same manner as described above for CZ method. Concurrently with the beginning of pulling, feeding of raw material is started through the vertical tube to the annular space of the rotating crucible to be uniformly distributed over its periphery. Particles of raw material fall onto the melt surface and are melted, and the melt from the annular space overflows to the inner container to provide continuous feeding of liquid raw material to the melt contained therein.

The similar apparatus is disclosed in U.S. Pat. No. 5,314,667 where a circular partition is centrally positioned in the cylindrical crucible, with a small gap between the lower end of partition and the bottom of crucible, providing overflow of the melt from the annular space (outside partition) to the inner space (inside partition).

The above described apparatus use a coaxial rotation of the crucible and of the crystal holder, and this ensures axial symmetry of thermal fields in the melt and in the growing crystal even though some elements of design, like feeding tube, trend to disturb concentric temperature distribution inside the growth furnace. With the same mass rates of growing and of feeding these apparatus also provide the stable position of the melt surface, what needs to be done first on the way of creation of the preselected shape of the solid-liquid interface.

The main disadvantages of the apparatus described in U.S. Pat. Nos. 2,892,739 and 5,314,667 result from a limited possibility of providing an adequate amount of overheating of the melt in the annular space of the crucible. The melt temperature in this space should be by a certain amount higher than the temperature of the melt in the inner space of the crucible, and the difference in these temperatures should be the greater, the higher the rate of feeding, hence the greater growth rate or growing crystal diameter. Failure to comply with this requirement would result in incomplete melting of raw material fed to annular space. On other hand, the melt temperature in the inner space is fairly close to the melting point and should not be above of certain level which depends on the pulling rate, crystal diameter, vertical temperature gradient near the solid-liquid interface of the growing crystal, etc. Because of a strong influence of the melt temperature in the annular space on the melt temperature in the inner space, this requirement either cannot be complied with at all or it may be met in the above described apparatus with substantial limitations, that is for certain performance parameters only (for example, for lower growth rates or smaller crystal diameters). Moreover, heat radiation loss from the upper end of partition, extending over the melt surface, can result in the occurrence of solidification of the melt on partition's walls. Once solidification starts on the inner wall of partition, solidified material grows toward crystal until touching it, thus interrupting the crystal growing operation. If solidification occurs on the outer wall of partition, it will assist to accumulation in the annular space of solid raw material particles which cannot be melted completely. Another disadvantage of the apparatus described in U.S. Pat. Nos. 2,892,739 and 5,314,667 resides in that outgrows may appear on the walls of annular space because of crystallization on the walls of liquid drops arising from splashes making by raw material particles hitting the melt surface, as well as due to direct incidence of these particles on the walls and their sticking to them. Gradual increase in the outgrows size sooner or later results in complete obturation of the radial gap in the annular space of the crucible, hence in the interruption of replenishing the melt with raw material and interruption of continuous growing process. Additional problem arises when these apparatus are used for growing crystals, which density in a solid form is less than in a liquid form, as in the case of silicon, for example. Thus, solid silicon particles, fallen into annular space, initially float on the molten silicon liquid surface; and, because the heat emissivity of silicon is higher in a solid form than in a liquid form, the solidification of the melt may be developed around these floating particles.

Similar apparatus, where the partition has several holes in its lower portion, providing overflow of the melt from annular space into inner space of the crucible, are described in U.S. Pat. Nos. 5,087,321, 5,087,429, 5,126,114, 5,139,750, 5,143,704 and 5,270,020. To solve the above mentioned problems all these apparatus contain heat insulating covers which are disposed above the molten liquid surface of annular space and above the top of partition. Besides, in some embodiments of these inventions the following additional devices are used:

auxiliary ring heater, positioned above the molten liquid surface outside the partition and under the heat insulation cover (U.S. Pat. Nos. 5,087,321 and 5,126,114);

auxiliary ring heater, positioned above the molten liquid surface of annular space and above the top of partition, without insulation cover above this heater (U.S. Pat. No. 5,087,429);

circular shield facing a meniscus position of the molten liquid at inner walls of the partition to reflect the heat radiation from meniscus portion, if this shield is made of carbon or metal it may be provided with electrodes to permit the supply of electric current and thereby to form it into electric resistance heater (U.S. Pat. No. 5,139,750).

In one of embodiments of U.S. Pat. No. 5,087,429 the partition comprises a resistance heater which is so designed that its outer periphery is heated to a higher temperature than its inner periphery; this immersed in the melt heater provides the greater difference of melt temperatures in the annular space and inside the partition.

Any or all above means aimed at preventing solidification of the melt on partition or crucible walls and at providing the entire melting of raw material particles, falling into the annular space of the crucible, may, of course, enhance the continuous growing process, but they don't eliminate the main cause of all mentioned above disadvantages: strong influence of the melt temperature in the annular space on the melt temperature in the inner space, or, in other words, zones of melting raw material and of growing single crystal are too close to each other. These means also unlikely may be universal, because in case of growing crystals of substances which melt has high vapor pressure (e.g. alkali halides) the condensation of vapors on shields and covers may disturb their normal functioning as well as may cause the accumulation of condensate and its subsequent falling into the melt.

U.S. Pat. No. 5,242,531 comprises the description of apparatus for growing crystals by CCZ method, where zones of melting raw material and of growing single crystal are sufficiently far apart from each other. The housing of the growth furnace contains an additional crucible with its heating elements which is arranged above the annular space of the main crucible from which the single crystal is being pulled. The bottom part of the additional crucible is provided with a capillary through which the liquid raw material can flow approximately in the center of annular space of main crucible. Additional crucible is half-filled with the melt which is replenished by melting in it the solid raw material in a particle or powder form fed from a hopper arranged outside the housing. The feeding rate of melt from additional crucible to main crucible is controlled by the power of heating element surrounding the capillary: if it is high enough the melt can pass through capillary into main crucible, if it is low enough the melt inside the capillary will be frozen and the flow of the liquid will be stopped. This kind of feed maintenance, strictly speaking, is not continuous and, because of alternating solidification and melting raw material in the capillary, can have some restrictions in respect of frequency of discrete feedings, which in some cases can be not high enough to be consistent with really continuous crystal growth. But the main disadvantage of the described apparatus is the lack of axial symmetry of the thermal field around the single crystal being pulled, caused by additional crucible with its heaters. The similar apparatus, having the same disadvantage, is described in U.S. Pat. No. 5,360,480; the housing of the growth furnace in this apparatus also contains additional crucible, of which the melted raw material can flow into a feeding tube over its open upper edge, positioned inside the crucible, when the falling solid raw material causes the raising of the melt level above the edge of that tube.

The other possibility of recharging melted raw material is described in U.S. Pat. No. 4,036,595. Adjacent the housing of the growth furnace there is a second housing of similar structure which has an additional crucible with the melt which is replenished by melting in it raw material fed from a canister disposed above that crucible. A tube, provided with a heating coil, extends from a point intermediate the bottom and the top surface of the melt in the additional crucible through the holes in the side walls of both housings to the top surface of the melt in the annular space of the main crucible from which a single crystal is being pulled. The feeding of the melt through this tube is controlled by building up pressure of inert gas in the second housing and therefore forcing the liquid to flow into the main crucible. When a desired level is reached, the pressure between both housings is equalized and liquid flow ceases. Disadvantages of this kind of recharging melted raw material may result from difficulties to create a reliable seal between walls of housings and incandescent feeding tube (heated above the melting point of raw material), what needs to be done both to provide a reliable control of the feeding rate and to prevent contamination of the melt due to air leaks when the growing is conducted at low pressures.

Another possibility of recharging melted raw material from adjacent additional crucible into the main crucible, that are disposed in two separate housings, is described in U.S. Pat. No. 4,282,184. A heated siphon tube for molten raw material transfer extends from additional crucible through the common side wall of both housings to the main crucible from which a single crystal is being pulled. The opposite ends of this tube are not deeply immersed within the melt contained in the first crucible and within the melt contained in the second crucible. The siphon tube is initially filled with molten raw material by raising pressure of inert gas in the housing surrounding additional crucible. Then, after equalizing the pressures of inert gas in both housings, siphon tube will establish the same level in both crucibles and for continuous growing solid raw material in a particle or powder form is added to and melted in the additional crucible during the process of pulling single crystal from the main crucible. A constant melt level is maintained by an optical monitoring device controlling by the rate of replenishment solid raw material. The apparatus does not use any partition between the growing crystal and the immersed end of siphon tube, and this is its obvious disadvantage, because the hotter molten raw material, supplied by heated to high temperatures siphon tube, may easily reach the perimeter of growing crystal and cause its partial melting. Besides, the lack of partition imposes a limitation on the rotation rate of the main crucible, because at high rotation speed some waves or ripples on the surface of the melt, arising from immersed end of the siphon tube, can reach the growing crystal and degrade its quality.

Figure 1:
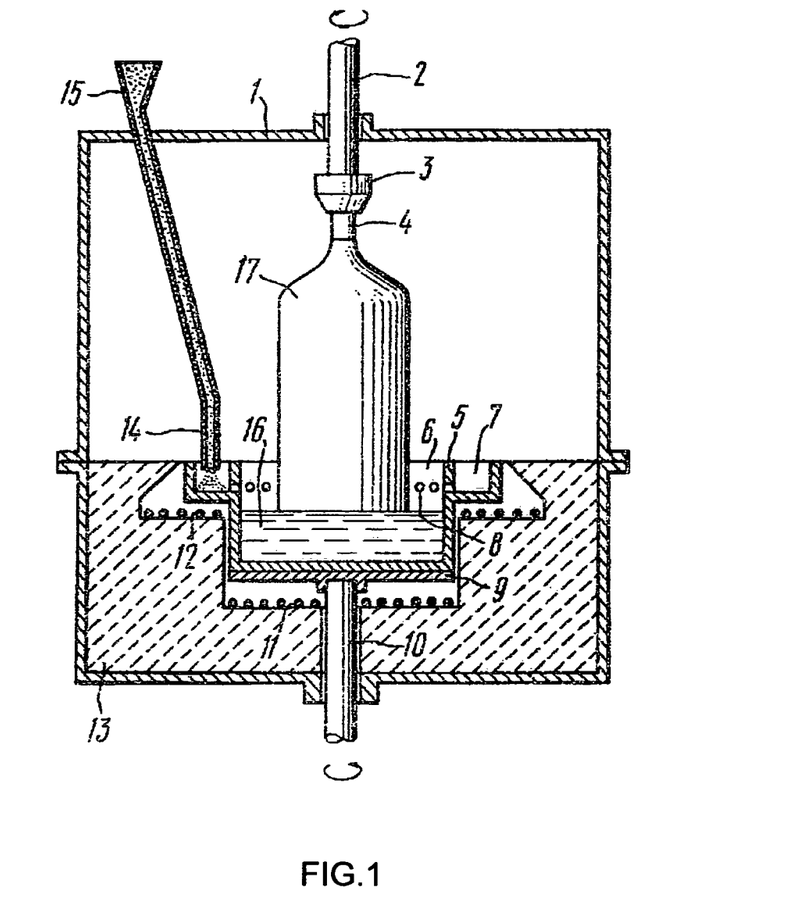
FIG. 1 is a schematic sectional view of known in the art apparatus, according to U.S. Pat. No. 4,203,951 (described in detail above).

The closest to present invention known in the art is an apparatus disclosed in U.S. Pat. No. 4,203,951. Schematic representation of this apparatus is shown in FIG. 1. The apparatus comprises a hermetic housing 1 receiving a rotary rod 2 carrying a holder 3 of a seed crystal 4. A crucible 5 consists of an inner container 6 and an outer container 7 communicating through small apertures 8 formed at the level of the bottom wall of the outer container. Crucible is mounted on a support 9 rigidly secured to a rotary rod 10. A lower part of the inner container 6 protruding downwards relative to the outer container 7 is designed to contain melt. A flat bottom heater 11 is disposed under the support 9, and a flat annular side heater 12 is located under the bottom wall of outer container 7. The electric heaters 11 and 12 are mounted on a pedestal 13 made of heat insulating material and are independently controlled. A tube 14 for feeding raw material into the annular space between containers 6 and 7 is received at the top in the housing 1. The vertical axis of the lower portion of the tube 14 is located about in the middle of the annular space of crucible 5, and the lower end face of tube 14 lies slightly below the upper end face of crucible 5. The apparatus also comprises means (not shown) for imparting rotation and reciprocations to the rod 2, for rotation of the rod 10 and for feeding the raw material to a funnel 15 of tube 14. The apparatus according to the invention functions in the following manner. Prior to the operation starting material is charged in the inner container 6 in an amount such after its melting the level of melt 16 should be slightly lower of apertures 8. After raw material is melted and the temperature of the bottom wall of outer container 7 becomes high enough to melt falling on its surface raw material particles, the growing process begins in the same manner as described above for CZ method. Concurrently with the beginning of pulling, feeding with raw material in a particle or powder form is started through tube 14 to the annular space between containers 6 and 7 of the rotating crucible 5 to be uniformly distributed over its periphery. Particles of raw material fall onto the hot bottom surface of outer container 7 and are melted on it, and immediately afterwards the melt overflows through apertures 8 to inner container 6 providing continuous feeding of liquid raw material to the melt contained therein. At the stage of growing of a single crystal 17 from the seed crystal 4 to a preset final diameter, the rate of feeding is gradually increased in accordance with the increase in the mass rate of growth of the single crystal enlarging in diameter. After the preset diameter is achieved, the feeding rate is then maintained at constant value.

Thus, the distinctive feature of this apparatus is a direct continuous flow of raw material to the bulk of the melt, from which the single crystal is being pulled, first in the solid state and then, just after melting, in the liquid state. In the case of growing crystals with doping impurities this feature presents a unique possibility for fixation the shape of the solid-liquid interface in the growing crystal by means of abrupt increasing of the impurity concentration in the bulk of the melt from zero to definite optimal value, with subsequent revealing the interface shape in the grown crystal through the difference in physical properties on each side of former interface. For example, in the case of activated scintillation crystals the first stage of growing process (from the seed to the final crystal diameter) can be performed using pure molten raw material. Then the feeding with pure solid raw material is abruptly changed onto feeding with its mixture with activator, the content of which is large enough to reach a definite optimal concentration in the bulk of the melt in a short period of time. Thereafter and to the end of the growing process the feeding is performed with a mixture having a lesser content of activator which provides its constant concentration in the melt and hence its uniform distribution in the whole rest volume of the grown crystal. Using an UV-lamp one can see in the grown crystal well-defined interface between non-acivated and acti-vated (luminescent) parts of the crystal which represents the exact shape of the former solid-liquid interface in the growing crystal.

The proper shape of the solid-liquid interface can be easily achieved by selection of optimal relationship between the temperatures of heaters 11 and 12. With maintenance of the same mass rates of growth and of feeding at all stages of the growing process, the level of melt 16 in crucible 5 and, hence, the solid-liquid interface do not change their position ensuring a stable thermal field in the vicinity of interface. The axial symmetry of the thermal fields in the melt and in the growing crystal is ensured by rotation of rods 2 and 10.

Nevertheless the apparatus under consideration is not free of disadvantages. The main disadvantage lies in the fact that the radiant heat exchange between the hottest lower part of growing crystal 17 and the cold walls of housing 1 is shielded by the inner walls of outer container 7 rising above the melt level. This makes difficult to remove the heat of fusion and forces to lower the temperature of melt 16 closer to the melting point resulting in limitation of growth rate, especially on the early stage of growing in length when the height of the crystal is less than the distance between the melt level and the upper end face of crucible 5. Another disadvantage comes from the fact that side heater 12 is located too close to the column of melt 16, and because of this there is definite limitation of its maximal allowable temperature resulting in restriction of the rate of melting raw material particles on the bottom of outer container 7, that is in restriction of the feeding rate. Besides, this also imposes restriction on the rate of crucible rotation; really, to avoid accumulation of the solid raw material in outer container 7, any portion of raw material particles fallen from tube 14 onto the bottom of this container must be melted on it for period of time which should not exceed the time of one complete revolution of the crucible, hence the allowable rotation rate should be the lesser the lower the temperature of side heater 12. One more disadvantage of the apparatus described in U.S. Pat. No. 4,203,951 is the lack of partition between the inner walls of crucible and the growing crystal; if the temperature of the melt flowing down from apertures 8 is substantially higher than the temperature of the bulk melt, the growing crystal may be partially melted at its perimeter.

BRIEF SUMMARY OF THE INVENTION

The principal object of the present invention which has been made to solve above-mentioned problems, is to provide a method and equipment which is able to perform outside the housing of the growth furnace continuous fast melting of raw material just after discharging it from feeder in a particle or powder form and immediate conveying this melted raw material by gravity, without any accumulation, to the crucible from which a single crystal is pulled.

Another object of the present invention is to provide an improved process of continuously growing single crystals by CCZ method that can ensure the wide range of independent control over the following process parameters: growth rate, feeding rate, rate of melting raw material being fed, rate of crystal rotation, rate of crucible rotation.

Finally, it is the object of the present invention is to provide possibility of independent control over the shape of the solid-liquid interface and of its stable location in the zone of maximal vertical temperature gradient, as close as possible to the upper edge of the crucible.

These objects are accomplished according to present invention by the provision of a melting furnace—a separate small furnace for melting raw material particles fallen into it at the top from a feeder. The housing of the melting furnace is mounted adjacent the housing of the growth furnace and is connected to it vacuum-tightly, forming a united hermetic volume. The melting furnace comprises a cylindrical heater and located inside it a cylindrical receiving container which accommodates a set of slope-wise plates, preferably a set of round conical plates. The upper conical plate is suspended on the rod attached at its apex and is slowly rotated around vertical axis to provide on its top surface a uniform circular distribution of raw material particles falling from the feeder through a vertical inlet pipe which axis is approximately halfway between the suspending rod and the edge of this plate. Partially melted particles slide in radial direction to the edge of upper conical plate and drop onto underlying fixed plate having the shape of truncated cone; the inner surface of this cone provides further sliding and melting of raw material particles. For complete melting several alternating fixed plates (cones and truncated cones) are added, and eventually the melted raw material flows into a crucible of the growth furnace through a heated conveying tube extending slantingly from the conical bottom of the receiving container to that crucible through coaxial openings in the housings of both furnaces. The crucible of the growth furnace has the shape of cylinder with flat bottom and a small inclined flange at its upper edge. A cylindrical partition with jagged lower edge is put on the bottom of the crucible. The outer diameter of the partition is only slightly less than the inner diameter of the crucible and their upper edges are positioned on the same level, so during feeding the melt is flowing from the end of conveying tube onto the inclined flange of the crucible and then into the gap between partition and crucible walls. The crucible is provided with a bottom heater and a side heater allowing performing growing at preset shape of the solid-liquid interface. Due to complete and rapid melting of solid raw material in the melting furnace the rate of replenishment crucible with melted raw material is defined solely by a feeder, positioned above the melting furnace; in other words, at continuous feeding the raw material flows continuously by gravity from the feeder to the crucible of the growth furnace, first in the solid state (powder, granules, pellets, etc.) and then in the liquid state. A replaceable hopper with raw material is positioned above the feeder, and together with a system of transport pipe, valves and seals this allows the performing of continuous crystal growth in vacuum or in inert gas, at controlled pressure.

These and other features, objects and advantages of the present invention will become more apparent from the following detailed description of a preferred embodiment with reference to the accompanying drawings.

DETAILED DESCRIPTION OF THE INVENTION

Figure 2:
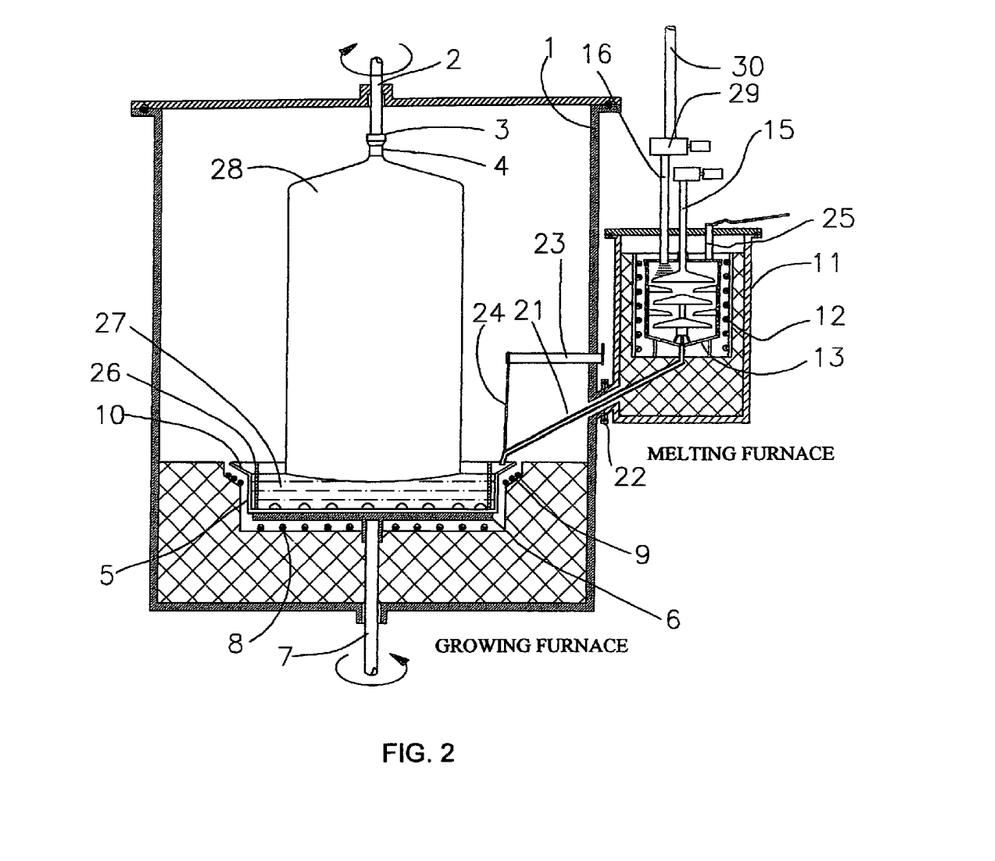
FIG. 2 is a schematic sectional view of the apparatus according to the present invention.

FIG. 2 is a schematic sectional view of the apparatus for continuously growing single crystals by Czochralski method according to the present invention. The apparatus comprises a growth furnace housing 1, a vertical crystal-pulling rod 2 provided with a holder 3 for a seed crystal 4, a crucible 5 which is mounted on a support 6 rigidly secured to a vertical rod 7. A bottom heater 8 is disposed under the support 6, and a side heater 9 surrounds the upper part of the crucible 5, being located just under its inclined flange 10 substantially in parallel with this flange. The apparatus also comprises drives (not shown) for rotation and reciprocation of the rod 2 and for rotation of the rod 7. Both rods are inserted vacuum-tightly into the housing 1.

A housing 11 of a melting furnace, which is intended for continuous melting of raw material, is mounted adjacent housing 1 and is connected to it vacuum-tightly, forming a united hermetic volume. The melting furnace comprises a cylindrical heater 12 and located inside it a cylindrical receiving container 13 with a conical bottom, which accommodates a set of slope-wise plates, preferably a set of round conical plates.

Figure 3:
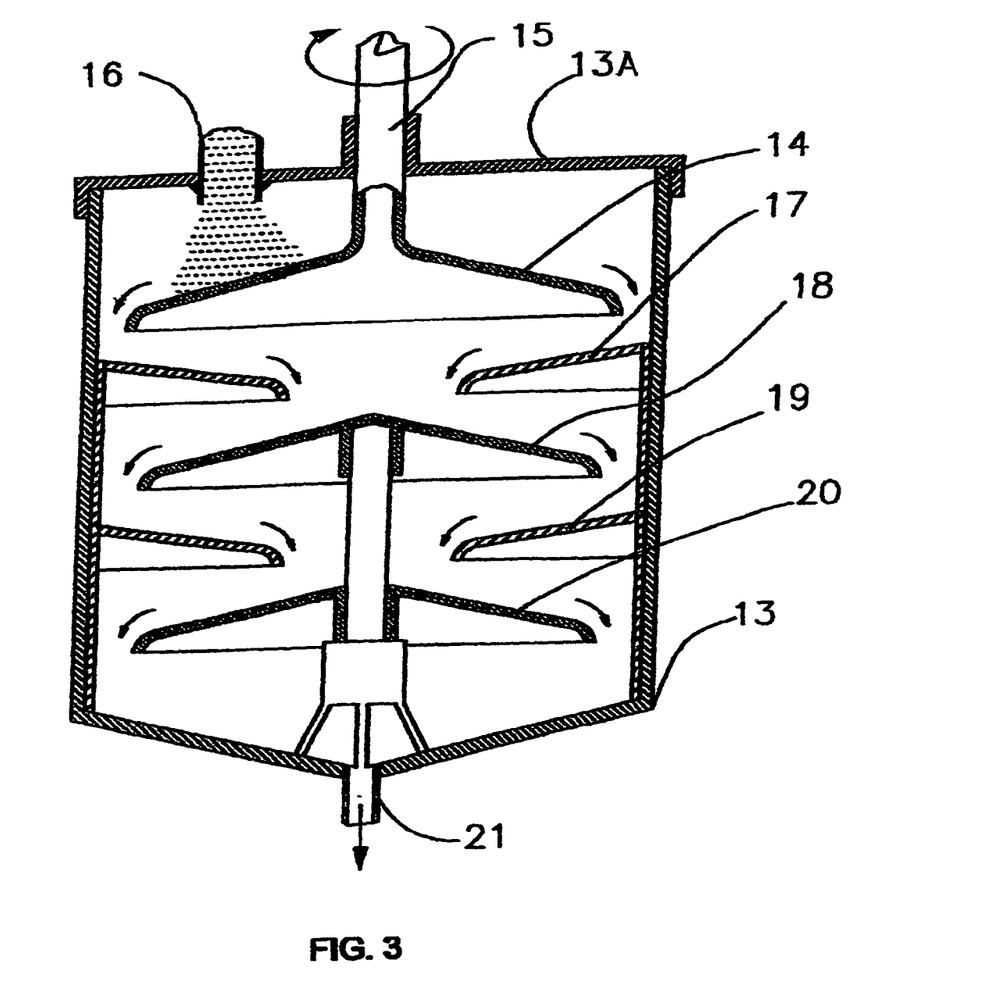
FIG. 3 is a schematic enlarged sectional view of the receiving container for continuous melting of raw material, according to the present invention.

The enlarged view of the receiving container 13 according to the present invention is shown in FIG. 3. Container has a flat cover 13A with two holes for passing through them a rotary rod 15 and an inlet pipe 16. An upper conical plate 14 is suspended on the rotary rod 15 attached to the apex of the cone. While feeding the conical plate 14 is slowly rotated around vertical axis to provide on its top surface a uniform circular distribution of raw material particles falling from the vertical inlet pipe 16 which axis is approximately halfway between the rod 15 and the edge of the plate 14. When the receiving container 13 has been heated above the melting point of raw material its partially melted particles slide over the surface of plate 14 in radial directions and drop onto an underlying fixed plate 17 having the shape of a truncated cone; the inner surface of this cone provides further sliding and melting of raw material particles. For complete melting several alternating fixed plates (for example, cone 18, truncated cone 19 and cone 20) are added, and eventually the melted raw material flows into the crucible 5 of the growth furnace through a conveying tube 21 extending slantingly from the conical bottom of the receiving container 13 to the crucible 5 through coaxial openings 22 in housings 1 and 11 of both furnaces (see FIG. 2). To prevent solidification of molten raw material inside the tube 21 it is made of metal and is supplied with electrodes at both ends for heating it by passing the electric current through it. If the receiving container is also made of metal, one of two electrodes may be connected directly with its wall. This case is shown in FIG. 2 where the lower end of the tube 21 is connected to an electrode 23 by means of spliced wire 24, the second electrode 25 is connected directly with the wall of the receiving container 13. A cylindrical partition 26, having jagged lower edge, is put on the bottom of crucible 5 to direct the flow of feeding molten material to the crucible bottom. The outer diameter of partition 26 is only slightly less than the inner diameter of crucible 5 and their upper edges are positioned on the same level. During feeding the melt is flowing from the end of conveying tube 21 onto the inclined flange 10 of the crucible 5 and then into the gap between partition 26 and crucible walls. Because this gap is rather small the temperature of feeding molten material quickly becomes equal to the temperature of the bulk melt 27 from which a single crystal 28 is pulled.

Figure 4:
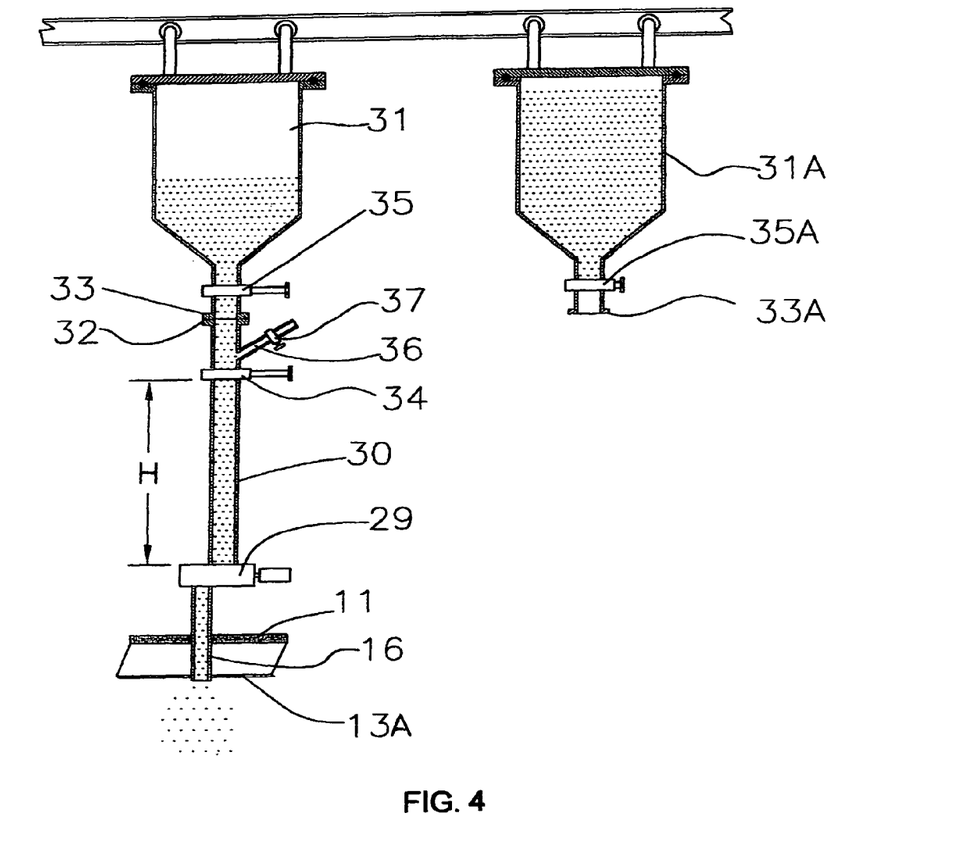
FIG. 4 is a schematic view showing an arrangement for continuous feeding with raw material in a particle or powder form, according to the present invention.

An arrangement for continuous supply the receiving container with raw material in a particle or powder form is shown in FIG. 4. It comprises a feeder 29, a vertical transport pipe 30 and a replaceable hopper 31. For the feeder 29 may be used any known in the art device capable of feeding small particles and powder of solid raw material into the inlet pipe 16 at a preset stable rate with a possibility of programming this rate. The lower end of the transport pipe 30 is vacuum-tightly connected to the feeder 29. At the upper end of this pipe there is a flange 32 for vacuum-tight connection with a flange 33 of the hopper 31. The transport pipe 30 and the hopper 31 are provided with identical vacuum valves 34 and 35. Above valve 34 there is a branch pipe 36, which is directed upward at acute angle to the axis of the transport pipe 30 and is provided with its own vacuum valve 37. The inner space between these three valves (34, 35 and 37) serves as a sluice chamber for evacuation of air and filling with inert gas through the branch pipe 36 after connection of hopper 31 with transport pipe 30 or before their disconnection, as described in detail below.

Advantageously, and in accordance with the preferred embodiment the length H of transport pipe 30 between feeder 29 and valve 34 should be high enough to accommodate within it the raw material in an amount which would be sufficient for uninterrupted supply of feeder 29 during time intervals when valve 34 is closed to provide replacement of hopper 31 (as described in detail below).

The apparatus according to the invention functions in the following manner (see FIG. 2-4). Prior to the operation, raw material is charged in crucible 5 in an amount such that after its melting the column of melt 27 should not exceed the height of the cylindrical part of crucible 5 (from its bottom to the base of its flange 10). The seed crystal 4 is fixed to holder 3, and rotary drives of rods 2 and 7 are activated. The hopper 31, full of raw material and filled with inert gas, with closed valve 35 is connected to transport pipe 30 by means of flanges 32 and 33. After evacuation of air from housings 1 of the growth furnace and 11 of the melting furnace, as well as from feeder 29 and transport pipe 30, all of these units are filled with inert gas through branch pipe 36 to a preset pressure, and then valves 34 and 37 are being closed. Valve 35 is opened and the pressure of inert gas in hopper 31 is measured. Valve 37 is opened for evacuation or filling inert gas to equalize the pressure in hopper 31 with the pressure of inert gas in all other units of the apparatus, thereafter valve 37 is being closed. Then valve 34 is opened and the raw material flows down to feeder 29. Heaters 8, 9, 12 and the heater of the conveying tube 21 are energized, and the starting charge in crucible 5 is melted. The rotary drive of rod 15 is activated. Thereafter, feeder 29 is actuated for a while to increase the melt column height in crucible 5 exactly to the height of its cylindrical part, as is shown in FIG. 2. After switching feeder 29 off, one can check whether there is any unacceptable delay in melting raw material particles on their rather long way in receiving container 13 (shown by arrows in FIG. 3), and if so the temperature of heater 12 should be correspondingly raised.

To start the growing process, seed crystal 4 is slowly lowered until it comes in contact with melt 27. After seed crystal 4 is partially melted, and equilibrium is established between seed crystal 4 and melt 27 (there should be neither melting nor crystallization on seed crystal 4), the drives of rod 2 and of feeder 29 are actuated to start pulling the growing crystal by lifting rod 2 with holder 3 of seed crystal 4, as well as feeding raw material into receiving container 13, where it is rapidly melted and then flows down by gravity into crucible 5. Further, the rate of pulling is maintained constant and the temperature of bottom heater 8 is controlled so that a single crystal 28 of increasing diameter grows on seed crystal 4 (preferably at constant temperature of side heater 9). At the stage of growth of single crystal 28 from seed crystal 4 to a pre-set final diameter, the feeding rate is gradually increased in accordance with the increase in the mass rate of growth of single crystal 28 enlarging in diameter. After the pre-set final diameter is achieved, the feeding rate is then maintained at constant level. With maintenance of the same mass rates of growth and of feeding at all stages of the growing process, the level of melt 27 in crucible 5, and hence the solid-liquid interface, do not change their position relative to heaters 8, 9 and crucible 5, thus ensuring the stable thermal conditions in the vicinity of the interface.

When the raw material in hopper 31 has been run out completely, it has to be replaced by identical hopper 31A (see FIG. 4), which was preliminarily charged with raw material and filled with inert gas. The replacement is performed in the following manner. After the upper end of a raw material column in transport pipe 30 has dropped to the level, which is slightly lower than valve 34, this valve is being closed. Since this moment all subsequent operations must be completed in a time that is known to be less than the time of an expenditure of the remaining raw material in transport pipe 30. The fulfillment of this condition will provide an uninterrupted supply of raw material to feeder 29 and hence the continuous growing of single crystal 28. That is why length H of the lower part of transport pipe 30, between feeder 29 and valve 34, should be high enough to accommodate within it sufficiently large amount of raw material. Just after valve 34 is closed valve 37 is being opened to equalize the pressure of inert gas in hopper 31 (and in the upper part of transport pipe 30) with atmospheric pressure. Then valves 35 and 37 are being closed and hopper 31 is being detached from transport pipe 30 by means of disconnecting flange 33 from flange 32. After empty hopper 31 is moved to the side, hopper 31A is being shifted to transport pipe 30 and connected to it by means of flanges 32 and 33A. After evacuation of air from the upper part of the transport pipe (between valves 34, 35A and 37) this space is filled with inert gas through branch pipe 36 with valve 37 open, to a pressure which is approximately equal to the pressure of inert gas in the hopper 31A, and then valve 37 is being closed. The valve 35A is opened and the pressure of inert gas in hopper 31A is measured. Valve 37 is opened for evacuation or filling inert gas to equalize the pressure in hopper 31A with the current pressure of inert gas in all other units of the apparatus, thereafter valve 37 is being closed. Finally valve 34 is being opened, and the raw material flows down filling transport pipe 30 at its full length. After raw material in hopper 31A has been run out completely all above operations are reiterated with any number of preliminarily charged hoppers, providing the continuous growth of the single crystal to any pre-set length.

To provide stable position of the melt level in crucible 5 during the whole process of growing, it is advantageous to use a highly sensitive melt level sensor (for example, known in the art optical or electro-contact sensor) which could be capable, together with additional means, of performing precise control over the feeding rate (see below case (a)) either over the growth rate (see below case (b)), or over the growing crystal diameter (see below case (c)).

(a) Control Over the Feeding Rate

In this known in the art case, the melt level sensor responds to the slightest changes of the melt level position in crucible 5, and gives out a command to correct the feeding rate in such a way as to prevent further deviation. For the apparatus according to the present invention, this kind of control looks to be highly flexible because of simple-to-change rate of feeding with the solid raw material followed by its rapid melting on the way to crucible 5. But in this case the melt level sensor solely cannot provide an automatically operated growing process, and for automation additional sensor should be used (for example, optical sensor of the growing crystal diameter).

(b) Control Over Growth Rate

In this known in the art case, in the course of continuous crystal pulling and continuous feeding with the pre-set mass rate, the melt level sensor responds to the slightest changes of the melt level position in crucible 5 and gives out a command to correct the temperature of bottom heater 8 (at constant temperature of side heater 9) so that mass growth rate of the crystal is equal to the pre-set mass feeding rate. It follows from the mass balance equation that $$d=2(\dot{m}/\pi\rho v)^{1/2}, \qquad (1)$$

where d is the diameter of the growing crystal, $\dot{m}$ is the mass feeding rate, v is the pulling rate, and $\rho$ is crystal density. It is evident from (1) that d is determined by the ratio $\dot{m}/v$, hence, stability of the feeding rate and of the pulling rate automatically ensures the stability of the pre-set diameter of the growing crystal. The stable value of $\dot{m}$ in the apparatus according to the present invention is provided not only by a constant flow of solid raw material from feeder 29 into inlet pipe 16, but also by rapid and complete melting of this material in receiving container 13 of the melting furnace. Unobstructed radiant heat exchange between the hottest part of growing crystal 28 and cold walls of housing 1 in this apparatus makes possible the use of rather high pulling rates v for any given crystal diameter d. In the case of a higher value of v, the mass feeding rate $\dot{m}$ can be independently increased (with raising also the temperature inside the receiving container 13 for more rapid melting) so that the ratio $\dot{m}/v$ will have the same value. By programming the ratio $\dot{m}/v$, it is possible to ensure automated broadening of the growing crystal starting from the seed and up to the final diameter. If it is not desirable to vary the axial rate of crystal growth (equal to the pulling rate v) automated broadening can be achieved only by programming the feeding rate $\dot{m}$.

(c) Control Over Growing Crystal Diameter

In this known in the art case pulling is performed discontinuously, over definite time intervals. By rapid lifting of crystal-pulling rod 2 at a certain very short distance s (short enough that as a result of partial extraction of a convex solid-liquid interface from the melt the area of the contact surface between the growing crystal and the melt changes insignificantly; for example, s≤0.5 mm), it is possible to get the precise value of the current crystal diameter d at the level of the melt surface through the measurement, by means of the melt level sensor, the corresponding value of h, the melt level drop in crucible 5. It follows from geometric consideration that $$d=D(1+s/h)^{1/2}, \qquad (2)$$

where D is inner diameter of crucible 5. After a comparison of the measured value of d with a pre-set one is made, a corresponding correction of temperature of bottom heater 8 is performed and then a command for feeding the melt is given out to restore its initial level. The raw material via inlet pipe 16 enters receiving container 13, and is rapidly melted there and flows down to crucible 5. The melt level sensor is used to follow the rise in height of bulk melt column 27 and to control the shut-off of feeder 29 at the appropriate melt level. After a short interval the melt level is stabilized and the cycle is repeated. Thus, the melt level sensor carries out two functions: measurement of the diameter of the growing crystal and control of the mean feeding rate which is maintained equal to the mass growth rate. With this, unlike the case of continuous feeding described above in (b), there is no necessity to stabilize the feeding rate. There is a need only to maintain it sufficiently high enough to avoid wasting time for the restoration of the starting melt level and thereby to shorten the cycle in order to get higher growth rate without increasing s.

In the apparatus according to the present invention this is easy to get simply by raising the temperature in receiving container 13 to the value, which would provide the rapid feeding with melted raw material without any delay. It should be noted that discontinuous pulling of the growing crystal at reasonably small values of s actually results in the continuous growth of the crystal. Consequently, methods of automated growing described in (b) and (c) are equivalent in respect of physical properties of the grown crystals.

Thus, with the use of a highly sensitive melt level sensor, the growing of single crystals in the apparatus according to the present invention may be easily automated, resulting in constant growth rate, constant growing crystal diameter and constant position of the melt level in the crucible.

As is evident from the foregoing the important feature of the present invention is the presence of the separately disposed melting furnace which provides the advantage of the melt replenishment process during growing single crystals by CCZ method. In accordance with the preferred embodiment fast and complete melting of raw material particles, falling into receiving container 13 of the melting furnace, is provided by uniform circular distributions of these particles on the surface of the rotating upper conical plate 14 and then on the surfaces of underlying plates. It is substantial that partially melted particles slide over alternating surfaces of cone and truncated cone without restraint, and the possibility of their local accumulation which could delay melting is excluded. This allows getting fast and complete melting even at temperatures in receiving container 13 that are only slightly greater than the melting point of raw material. Of course, greater feeding rates will require higher temperatures therein, and that can be done simply by raising the temperature of heater 12, without any negative consequences. Thus, the present invention provides the flexible control over the rate of replenishment of crucible 5 with melted raw material simply through the control over the rate of supply of receiving container 13 with solid raw material in a particle or powder form.

Advantageously and in accordance with the preferred embodiment the melted raw material is pouring from conveying tube 21 not on the surface of melt 27, but over the surface of inclined flange 10 of crucible 5, thus preventing splashing of liquid which could result in the appearance of outgrowths on the walls of partition 26.

The present invention provides the further advantage that the shape of the solid-liquid interface of the growing crystal may be independently controlled by a relationship between temperatures of bottom heater 8 and of side heater 9. For fast and steady growth, the solid-liquid interface should be located in the zone of maximal vertical temperature gradient. This is achieved in the apparatus according to the present invention simply by positioning the melt mirror in crucible 5 on the level of the base of inclined flange 10, close enough to the upper edge of crucible 5 to get an unobstructed radiant heat exchange between the hottest part of growing crystal 28 and cold walls of housing 1. In case of growing crystals with doping impurities, the real shape of the solid-liquid interface at early stages of the growth process may be fixed in the growing crystal by abrupt increasing of the impurity concentration in melt 27 from zero to definite optimal value, in the same way as described above in evaluation of U.S. Pat. No. 4,203,951.

Thus, the present invention provides the advantage of a process of continuous growing single crystals by CCZ method, ensuring flexible and independent control over all growth parameters and, therefore, providing high quality of crystals grown. By means of highly sensitive electro-contact or optical melt level sensor the growth process may be automated resulting in constant growth rate, constant growing crystal diameter and constant position of the melt level in the crucible.

From the above consideration it is clear that the apparatus according to the present invention may be successfully used for growing large-sized single crystals, such as scintillation alkali halide single crystals, as well as semiconductor single crystals.

While this invention has been described with reference to its preferred embodiment it is obvious to those skilled in the art that various changes and modifications may be made therein without departing from the spirit and the scope of this invention as defined in the appended claims.

We claim:

1. An apparatus for continuously growing single crystals from a melted raw material, comprising:
    a substantially cylindrical crucible with an inclined flange at its upper part for containing a melt of said material from which a growing crystal is pulled, said crucible being enclosed in a housing of a growth furnace;
    two independent heaters surrounding said crucible;
    a drive to rotate said crucible relative to said heaters during pulling said growing crystal from said melt contained therein;
    drives to pull and rotate said growing crystal;
    a receiving container for melting raw material in a particle or powder form which has fallen in it, said container being enclosed in a housing of a melting furnace which is mounted adjacent said housing of the growth furnace;
    a heater surrounding said receiving container to maintain therein the temperature above the melting point of said raw material;
    a set of slope-wise plates in the form of a round cone and in the form of a truncated cone being enclosed in said receiving container which is shaped like a cylinder with a conical bottom and a flat cover, having two holes for passing through them a rotary rod and an inlet pipe for supplying said receiving container with said raw material, the upper conical plate being suspended on said rotary rod, the underlying fixed plate, having the shape of the truncated cone, with several alternating fixed plates (cones and truncated cones) being placed in the downward direction, and also with the axis of said rotary rod being coincident with the axis of said cylinder and the axis of said inlet pipe being approximately halfway between said rotary rod and the edge of said upper conical plate, providing on the surface of this plate during its rotation a uniform circular distribution of raw material particles falling through said inlet pipe and therefore providing a uniform circular distribution of partially melted particles on underlying plates to get complete and rapid melting of said raw material through unobstructed sliding of partially melted raw material particles over the surfaces of said plates;
    a conveying tube, extending slantingly from the bottom of said receiving container to said crucible through coaxial openings in both of said housings, to ensure a flow of melted raw material for replenishing said melt during pulling said growing crystal;
    a feeder mounted above said housing of the melting furnace to supply raw material in a particle or powder form into said receiving container;
    a replaceable hopper for containing raw material in a particle or powder form positioned above said feeder; and
    a vertical transport pipe connecting said hopper with said feeder which with a system of valves and seals provides uninterrupted supply of raw material in a particle or powder form to said feeder during the whole growth process.

2. The apparatus for growing single crystals according to claim 1 wherein said crucible is provided with a cylindrical partition having a height which is equal to the depth of said crucible and the outer diameter which is only slightly less than the inner diameter of said crucible, thus extending above the surface of said melt and defining between the walls of said partition and said crucible a narrow outer space into which said melted raw material, flowing down from said inclined flange after receiving there from the end of said conveying tube, is introduced; said partition having a jagged lower edge whereby melt can move from said outer space to the central part of said crucible.

3. The apparatus for growing single crystals according to claim 1 wherein one of said heaters is disposed under the bottom of said crucible in order to apply the thermal energy to said melt required to permit formation of said growing crystal and the other heater is disposed under said inclined flange of said crucible substantially in parallel with this flange in order to prevent solidification on its surface of said melted raw material flowing down on it from the end of said conveying tube.

4. The apparatus for growing single crystals according to claim 1 wherein said conveying tube is made of metal and is supplied with electrodes at both ends for heating it by passing the electric current through it in order to prevent solidification of said melted raw material in said conveying tube.

5. The apparatus for growing single crystals according to claim 1 wherein said vertical transport pipe of definite chosen inner diameter rises above said feeder on the height which is sufficient to accommodate inside its volume said raw material in a particle or powder form in an amount that is large enough for providing uninterrupted supply of said feeder with said raw material during time intervals when an empty hopper is disconnected from the upper end of said transport pipe and is replaced by a hopper filled with raw material.

* * * * *